(12) United States Patent
Holahan et al.

(10) Patent No.: US 9,976,812 B2
(45) Date of Patent: May 22, 2018

(54) DUAL MAGNETICALLY COUPLED ROTOR HEAT EXCHANGER

(71) Applicant: International Business Machines Corporation, Armonk, NY (US)

(72) Inventors: Maurice F. Holahan, Lake City, MN (US); Eric V. Kline, Rochester, MN (US); Paul N. Krystek, Highland, NY (US); Michael R. Rasmussen, Mazeppa, MN (US); Arvind K. Sinha, Rochester, MN (US); Stephen M. Zins, Oronocco, MN (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 14/796,041

(22) Filed: Jul. 10, 2015

(65) Prior Publication Data
US 2015/0318231 A1 Nov. 5, 2015

Related U.S. Application Data

(62) Division of application No. 12/959,477, filed on Dec. 3, 2010, now Pat. No. 9,170,056.

(51) Int. Cl.
*G05D 23/00* (2006.01)
*F28D 15/00* (2006.01)
(Continued)

(52) U.S. Cl.
CPC ........... *F28D 15/00* (2013.01); *F04D 13/024* (2013.01); *F04D 29/586* (2013.01);
(Continued)

(58) Field of Classification Search
CPC ............. F28D 15/00; F28D 2015/0291; F04D 13/024; F04D 29/586; F04D 13/04;
(Continued)

(56) References Cited

U.S. PATENT DOCUMENTS 3,938,914 A * 2/1976 Zimmermann ....... F04D 13/027
310/104
4,135,863 A 1/1979 Davis et al.
(Continued)

FOREIGN PATENT DOCUMENTS

JP 62237093 10/1987
JP 06257553 9/1994
(Continued)

*Primary Examiner* — Travis Ruby
(74) *Attorney, Agent, or Firm* — Lieberman & Brandsdorfer, LLC

(57) ABSTRACT

An apparatus for cooling an electrical heat source is disclosed. A heat exchanger has two principal sub-assemblies. A closed-loop fluid flow is provided through a second sub-assembly, disposed next to a heat source. An open-loop fluid flow is provided though a first sub-assembly in communication with a second sub-assembly. Each of the first and second sub-assemblies has a rotational element. The fluid flow entering the first sub-assembly rotates the first rotational element, and magnetic communication between the rotational elements causes movement of the second rotational element, thereby achieving fluid movement within the second sub-assembly. Operationally, the closed-loop sub-assembly removes heat from the heat source and transfers it to the open-loop sub-assembly for subsequent heat transfer in a downstream fluid flow.

20 Claims, 6 Drawing Sheets

(51) Int. Cl.
*F04D 13/02* (2006.01)
*F04D 29/58* (2006.01)
*H01L 23/473* (2006.01)

(52) U.S. Cl.
CPC ........ *H01L 23/473* (2013.01); *F28F 2250/08* (2013.01); *H01L 2924/0002* (2013.01)

(58) Field of Classification Search
CPC ............ H01L 23/473; H01L 2924/0002; F28F 2250/08; H05K 7/2079
See application file for complete search history.

(56) References Cited

U.S. PATENT DOCUMENTS

| | | | | |
|---|---|---|---|---|
| 5,039,286 A | * | 8/1991 | Point | F04D 13/06 |
| | | | | 415/129 |
| 5,431,216 A | * | 7/1995 | Ogushi | F28F 13/125 |
| | | | | 165/122 |
| 5,441,102 A | | 8/1995 | Burward-Hoy | |
| 5,763,951 A | | 6/1998 | Hamilton et al. | |
| 6,019,165 A | * | 2/2000 | Batchelder | F25B 21/02 |
| | | | | 165/104.33 |
| 6,021,844 A | * | 2/2000 | Batchelder | F24J 3/00 |
| | | | | 165/104.33 |
| 6,030,188 A | * | 2/2000 | Nojiri | A61M 1/101 |
| | | | | 415/900 |
| 6,119,462 A | * | 9/2000 | Busick | B67D 1/0869 |
| | | | | 62/3.3 |
| 6,166,907 A | * | 12/2000 | Chien | F28D 1/0478 |
| | | | | 165/104.33 |
| 6,175,495 B1 | | 1/2001 | Batchelder | |
| 6,208,512 B1 | * | 3/2001 | Goldowsky | F04D 3/02 |
| | | | | 165/104.33 |
| 6,408,937 B1 | * | 6/2002 | Roy | H01L 23/427 |
| | | | | 165/104.22 |
| 6,600,649 B1 | * | 7/2003 | Tsai | H01L 23/473 |
| | | | | 165/104.33 |
| 6,623,475 B1 | | 9/2003 | Siess | |
| 6,763,880 B1 | * | 7/2004 | Shih | G06F 1/20 |
| | | | | 165/104.22 |
| 6,827,131 B1 | * | 12/2004 | Chang | F28D 1/024 |
| | | | | 165/121 |
| 6,839,234 B2 | * | 1/2005 | Niwatsukino | F28D 15/0266 |
| | | | | 165/80.3 |
| 7,055,581 B1 | * | 6/2006 | Roy | H01L 23/427 |
| | | | | 165/104.21 |
| 7,165,413 B2 | | 1/2007 | Symons | |
| 7,274,566 B2 | | 9/2007 | Campbell et al. | |
| 7,307,841 B2 | | 12/2007 | Berlin et al. | |
| 7,379,301 B2 | * | 5/2008 | Liu | H01L 23/473 |
| | | | | 165/104.31 |
| 7,438,120 B2 | * | 10/2008 | Hong | H01L 23/427 |
| | | | | 165/104.26 |
| 7,476,077 B2 | | 1/2009 | Woodard et al. | |
| 7,694,721 B2 | * | 4/2010 | Lai | H01L 23/4006 |
| | | | | 165/104.33 |
| 7,729,118 B2 | * | 6/2010 | Lai | H01L 23/473 |
| | | | | 165/104.33 |
| 7,764,494 B2 | | 7/2010 | Balzano | |
| 7,976,271 B2 | * | 7/2011 | LaRose | A61M 1/101 |
| | | | | 415/104 |
| 9,170,056 B2 | * | 10/2015 | Holahan | F04D 13/024 |
| 2003/0072656 A1 | * | 4/2003 | Niwatsukino | F04D 5/002 |
| | | | | 417/354 |
| 2005/0168079 A1 | * | 8/2005 | Wos | F04D 13/06 |
| | | | | 310/52 |
| 2005/0168947 A1 | | 8/2005 | Mok et al. | |
| 2005/0241312 A1 | * | 11/2005 | Hata | F04D 29/588 |
| | | | | 60/649 |
| 2005/0244292 A1 | * | 11/2005 | Tomioka | F04D 29/026 |
| | | | | 417/423.7 |
| 2006/0180300 A1 | | 8/2006 | Lenehan et al. | |

FOREIGN PATENT DOCUMENTS

| | | |
|---|---|---|
| JP | 2001015662 | 1/2001 |
| JP | 2006173511 | 6/2006 |
| JP | 2008248698 | 10/2008 |
| JP | 2009008055 | 1/2009 |

* cited by examiner

DUAL MAGNETICALLY COUPLED ROTOR HEAT EXCHANGER

CROSS REFERENCE TO RELATED APPLICATION(S)

This application is a divisional patent application claiming the benefit of the filing date of U.S. patent application Ser. No. 12/959,477 filed on Dec. 3, 2010 and titled "Duplex Flexible Heat Exchanger" now pending, which is hereby incorporated by reference.

BACKGROUND

The invention relates to a heat exchanger for cooling a heat source. More particularly, the heat exchanger is a multi-component system in communication with a fluid flow to dissipate heat from the heat source.

One of the challenges facing electronic technology is the effective dissipation of heat from a heat generating electronic component. As electronic components have evolved, heat byproduct has increased. If the heat is not effectively removed from the component(s), the component(s) may be subject to instability and failure.

One of the known approaches to solve the problem identified above is to cool the electronic components by using a heat exchange system. In fact, there are many types of heat exchange components and systems. Heat exchangers may be classified as passive and active. However, regardless of the classification, the primary focus of the heat exchanger is to dissipate heat from the heat generating component. Most heat exchanger have a thermally conductive base placed adjacent to the heat generating component to facilitate transfer of heat from the heat generating component to the base. The passive system generally employs a fin field in communication with the base to complete the heat dissipation. The active system generally employs a fluid flow in communication with the base to complete the heat dissipation. The channel is encapsulated within the chamber and extends from the input port to the output port to define a flow path. The channel is configured to convey a cooling fluid for absorbing and dissipating the heat from the heat generating component. However, the prior art solution has a number of disadvantages and is not very effective. More specifically, the liquid cooling is perceived as expensive and heavy and having maintenance problems due to leaks, fouling, and corrosion.

Accordingly, there exists a need in the art for an effective cooling apparatus that may be used in small electronic devices. More specifically, there is a need for a cooling apparatus that is able to effectively circulate liquid to quickly and efficiently remove heat from a heat generating component.

SUMMARY

This invention comprises a system, method, and article for supporting a heat exchanger to cool a heat source.

In one aspect of the invention, an apparatus is provided to dissipate heat from a heat source. A first rotational element is provided housed within a first chamber and having a first magnet, and a second rotational element is provided housed within a second chamber and having a second magnet. The first rotational element is in magnetic communication with the second rotational element. The first chamber has both a fluid inlet and a fluid outlet. A first viscous fluid enters the first chamber via the inlet with a first flow, and the first flow rotates the first rotational element. A magnetic relationship between the chambers, and specifically movement of the first magnet causes the second magnet of the second chamber to rotate the second rotational element in communication with the second magnet.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of modules, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

In the following description of the embodiments, reference is made to the accompanying drawings that form a part hereof, and which shows by way of illustration the specific embodiment in which the invention may be practiced. It is to be understood that other embodiments may be utilized because structural changes may be made without departing from the scope of the present invention.

Figure 1:
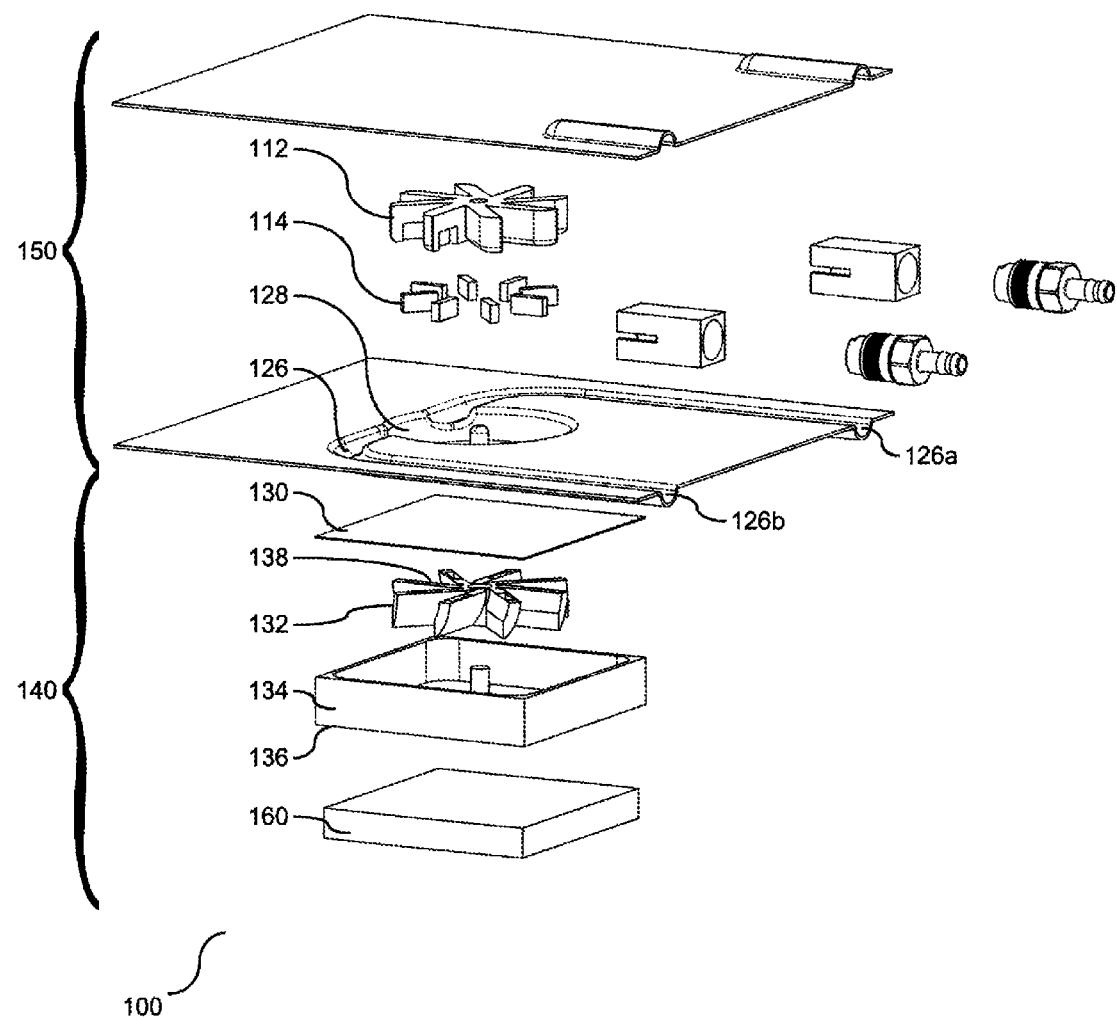
FIG. 1 is a block diagram illustrating elements of the heat exchanger, including the open and closed loop sub-assemblies.

FIG. 1 is a block diagram illustrating components of a heat exchanger (100). The heat exchanger (100) includes two sub-assemblies, a first sub-assembly in the form of an open loop sub-assembly (150) and a second sub-assembly in the form of a closed loop sub-assembly (140). The first and second sub-assemblies (150) and (140), respectively, function together to dissipate heat from a heat source.

The open loop sub-assembly (150) includes a chamber (128) in communication with a channel (126), also known herein as a cooling channel, through which fluid flows. The cooling channel has an inlet (126a) and an outlet (126b). The inlet (126a) functions to enable fluid to flow into the chamber (128) and directed to the chamber (128). Similarly, the outlet (126b) functions to discharge fluid from the chamber (128). In one embodiment, the fluid is in the form of a coolant. Although a single channel (126) is shown herein, in one embodiment, the open loop sub-assembly (150) may include a plurality of channels to further support heat exchange. Similarly, the number of the input and output channels are not limited to two channels and depend on a specific embodiment. A first rotational element (112) is housed within the chamber (128). The first rotational element (112) rotates along an axis when subject to fluid flow as received from the inlet (126a) of the cooling channel (126), and directs the rotation of the fluid flow to the outlet (126b). Accordingly, the sub-assembly (150) is an open loop as it receives fluid input from an external source, and delivers fluid output to an external source.

As shown herein, the first rotational element (112) is an impeller. The invention should not be limited to this formative of the first rotational element. In one embodiment, the first rotational element (112) may be in a different form. One or more magnets (114) are embedded into the first rotational element (112). Although a plurality of magnets (114) are shown in this example, the quantity of magnets (114) illustrated is not a limiting factor. The magnet(s) (114) of the first rotational element (112) are employed to communicate with a second rotational element (132) in the second sub-assembly (140).

As shown in FIG. 1, the closed loop sub-assembly (140) includes a closed loop chamber (134) having a top cover (130) and a base (136), with the base (136) of the sub-assembly (140) mounted adjacent to an electronic heat source (160). In one embodiment, a thermal interface material is used to mate the base (136) within the electronic heat source (160). In one embodiment, the thermal interface material may be in the form of high thermally conductive grease, gel or other interface material. The second rotational element (132) is housed in the closed loop chamber (134). The second rotational element (132) rotates along an axis in response to rotation of the first rotational element (112). More specifically, the sub-assembly (140) is a closed loop system that houses a fluid (not shown) within the chamber. In one embodiment, the closed loop chamber (134) houses the closed loop sub-assembly and is hermetically sealed. As the sub-assembly (140) is a closed loop system there is no inlet or outlet for the fluid. Fluid flow is created in the closed loop chamber (134) by movement of the second rotational element (132). Accordingly, the sub-assembly (140) is a closed loop system as the fluid housed within the chamber (134) is static until such time as the second rotational element (132) is subject to movement.

Both the first and second rotational elements (112) and (132), respectively, employ at least one magnet (114) and (138), respectively. The first rotational element (112) is subject to movement from the fluid flow received from the inlet (126a). The magnetic relationship between the magnet (114) of the first rotational element (112) and the magnet (138) of the second rotational element (132) causes movement of the second rotational element (132). In one embodiment, magnetic induction between the first and second rotational elements (112) and (132) supports movement of the second rotational element (132). In one embodiment, the first and second rotational elements are in the form of an impeller. The second magnetic rotational element (132) starts rotating in response to rotation of the first magnetic rotational element (112) thereby achieving fluid movement within the closed-loop chamber (134) that causes high thermal transfer efficiency between the heat source (160) and the closed loop sub-assembly (140). Accordingly, the closed-loop sub-assembly removes the heat from the heat source (160) and transfers it to the open-loop sub-assembly (150) for subsequent dissipation in a downstream heat exchanger or discharge into effluent through the output channel (126b).

As described above, the closed loop chamber (134) is provided with a fluid that is subject to flow upon movement of the second rotating element, and the open loop chamber (128) is subject to flow based upon velocity of the fluid received from the fluid inlet (126a). In one embodiment, the fluid received from the fluid inlet (126a) may be in the same form as the fluid in the closed loop chamber. Similarly, in one embodiment, the fluid received from the fluid inlet (126a) may be in a different form than the fluid in the closed loop chamber. Regardless of whether the fluids are the same or different, the fluid in the closed loop system should have a temperature that is cooler than the temperature of the heat generating device in order to support heat exchange. Similarly, the fluid in the open loop system must be of a temperature and have properties that support heat exchange from the fluid of the closed loop system. In one embodiment, the fluid in both the closed and the open loop chambers is water. In another embodiment, a variety of other liquids, such as Gallium, GaInSn, or any low melt temperature and high conductivity metal or alloy, may be employed in the closed-loop sub-assembly (140). It is understood that in the event Gallium, or some other low temp metal or alloy, is used in the closed-loop sub-assembly, a non-reactive or inert barrier may be required to prevent alloy or amalgam formation.

Figure 2:
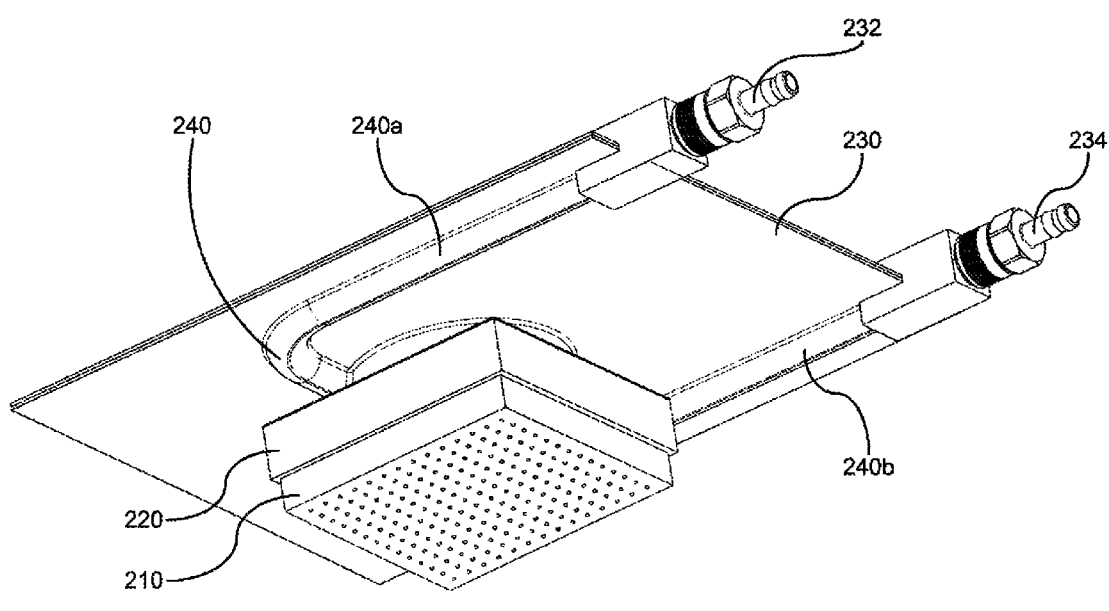
FIG. 2 is a block diagram illustrating an assembled heat exchanger shown in FIG. 1.

FIG. 2 is a block diagram (200) illustrating an assembled heat exchanger. A heat source (210) is shown in direct communication with the closed loop sub-assembly (220) of the heat exchanger. The heat source (210) has an indirect communication with the open loop sub-assembly (230) through the closed loop sub-assembly (220). As shown, a channel (240) is provided in the open loop sub-assembly (230). More specifically, the channel (240) includes input and output channels (240a) and (240b), respectively. Fittings (232) and (234) are provided in communication with the input and output channels (240a) and (240b), respectively.

In one embodiment, the fittings (232) and (234) are used to regulate fluid flow through the channel (240) of the open loop sub-assembly (230).

Figure 3:
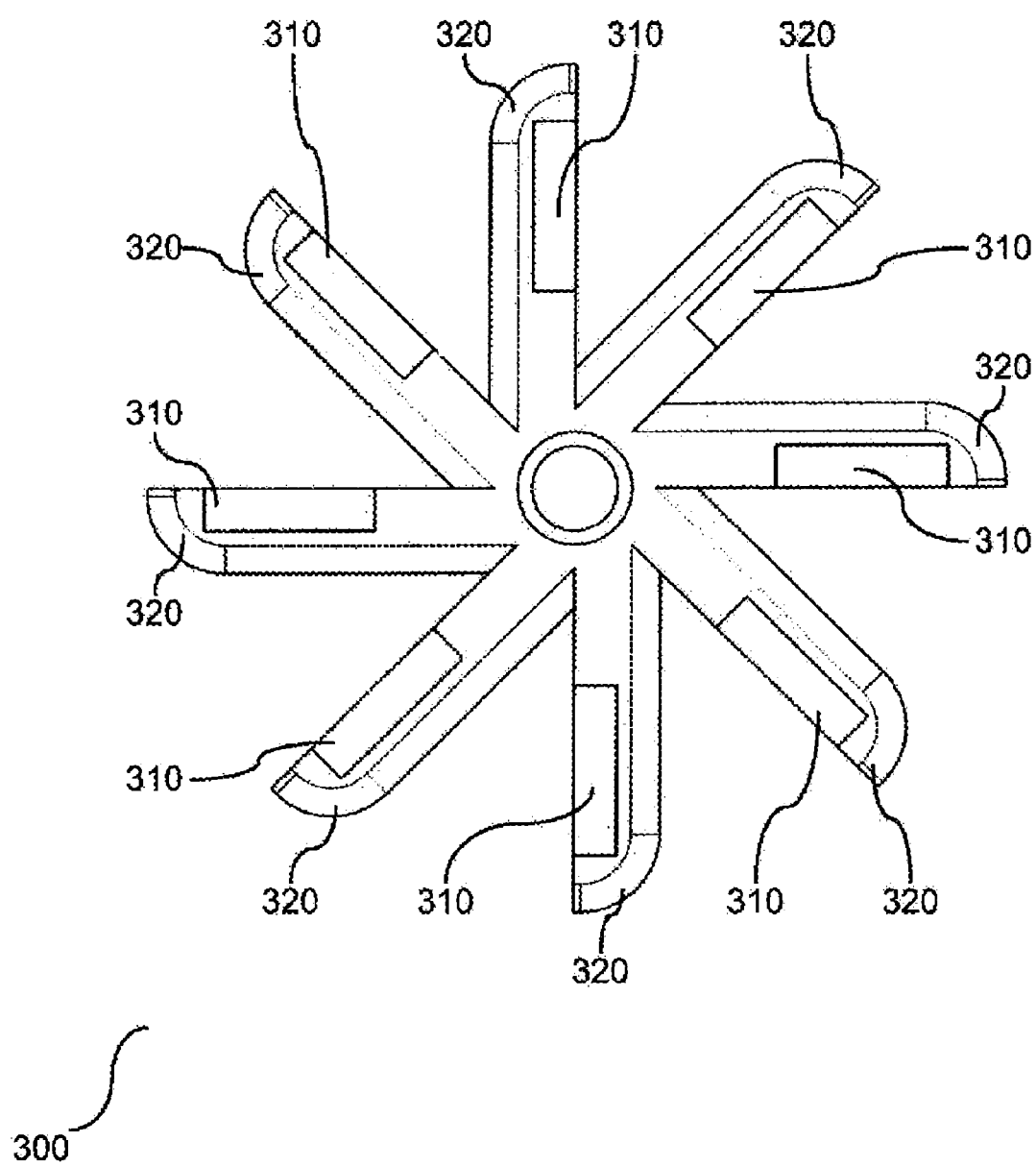
FIG. 3 is a block diagram illustrating an impeller with magnets embedded into impeller's blades.

As described above and shown in FIG. 1, both the first and second rotational elements (112) and (132) of the open and closed loop sub-assemblies (150) and (140), respectively, each include at least one magnetic element. FIG. 3 is a top view of one of the rotational elements in the form of an impeller (300). As shown, the impeller (300) has multiple blades (320) with each blade having at least one magnet (310) embedded into the impeller's blades (320). In one embodiment, the relationship of the polarity of magnets causes the rotation. For example, in one embodiment, each magnet (310) has a top surface, shown as (310) and a bottom surface (not shown), with the top and bottom surfaces having different poles of the magnet. The bottom surface (not shown) is spaced apart from a top surface of a magnet of the second rotational element, as shown in FIG. 1. In one embodiment, the magnets of the first and second rotational elements are skewed so that the attracting or repelling force between the poles of the different magnets during rotation of the first rotational element causes the rotation of the second rotational element. The magnetic pole of the bottom surface of the magnet of the first rotational element is the same polarity of the top surface of the magnet of the second rotational element with the repelling force between the magnets facilitating movement of the second rotational element, or the magnetic pole of the bottom surface of the magnet of the first rotational element is the opposite polarity of the top surface of the magnet of the second rotational element with the attracting force between the magnets facilitating movement of the second rotational element. Accordingly, the magnetic alignment of the magnets of the first and second rotational elements enables the rotation of the second rotational element in the closed loop sub-assembly. Alternatively, the magnets may be arranged so that opposite poles attractively couple, with all poles embedded in the rotational element in a similar orientation. Further, magnetic poles within a rotational element could be alternating, or oriented in a similar fashion over some section of the rotational element, for example, half of the rotational element could be oriented with positive poles toward the top, while the other half of the poles would be oriented with the negative poles oriented toward the top. The key operational feature is to have both sets of magnets in the first and second rotational elements magnetically complementary to maximize coupling forces.

Figure 4:
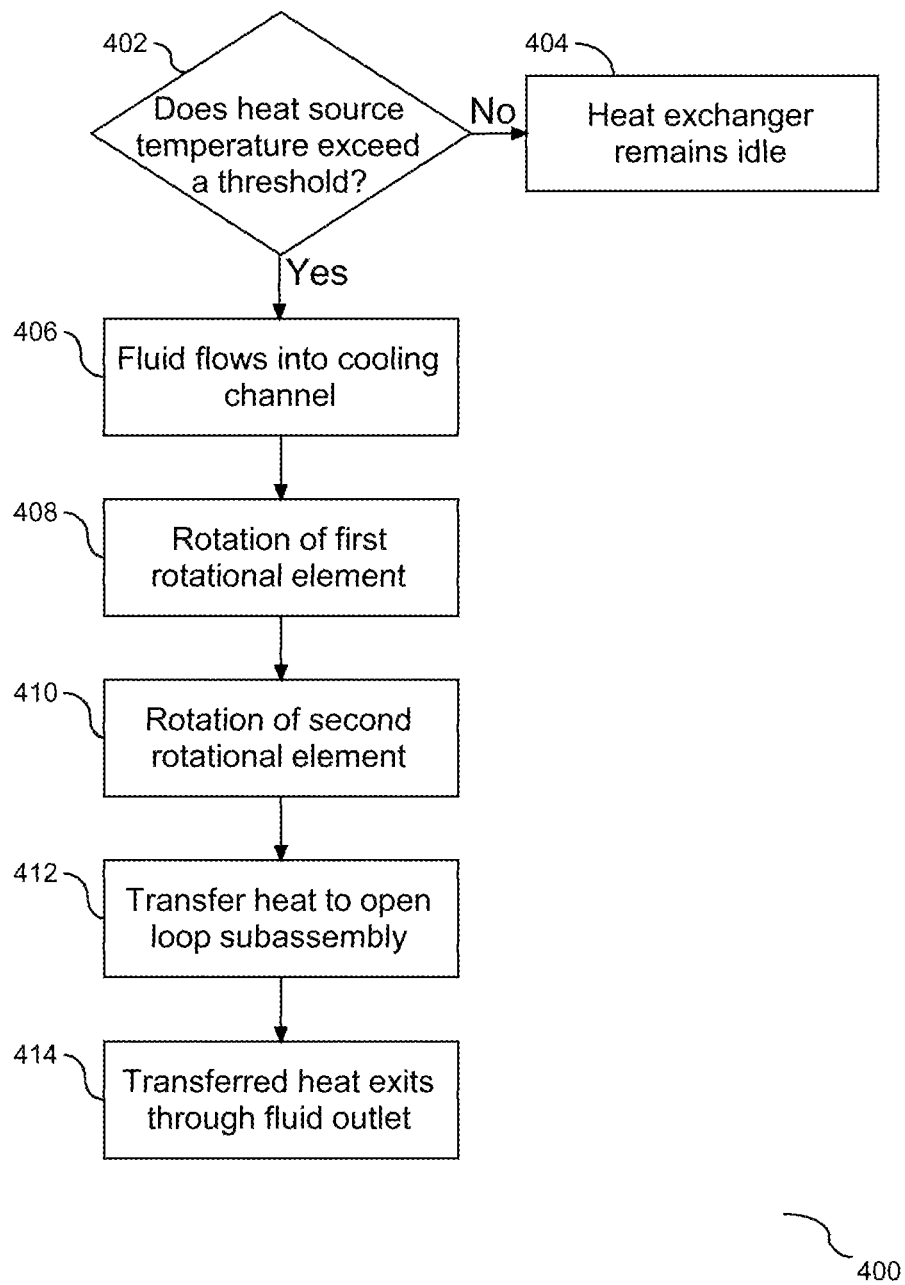
FIG. 4 is a flow chart illustrating the process of cooling a heat source using the heat exchanger shown in FIGS. 1-3.

FIG. 4 is a flow chart (400) pertaining to management of heat exchange for the devices described above and shown in FIGS. 1-3. The temperature of the heat source is monitored to ensure that it does not exceed a fixed or variable threshold temperature. More specifically, the threshold temperature may be a guideline employed to activate the heat exchanger or the heat exchanger may be on at all times. In step (402), it is determined whether the temperature associated with a heat source exceeds a threshold. A negative response (404) to the determination at step (402) enables the heat exchanger to remain in an idle operating state. In contrast, a positive response to the determination at step (402) activates the heat exchanger. In one embodiment, a control system may be employed to monitor the temperature of the heat source and to manage activation of the heat exchanger, otherwise the heat exchanger may be on at all times.

Activation of the heat exchange includes an opening of the fluid inlet of the open loop sub-assembly to allow fluid to flow into the cooling channel (406). The fluid that enters the cooling channel has a flow rate. It is the force of the fluid based upon the flow rate that causes a first rotational element in the fluid flow path to rotate (408). As described above, the first rotational element has at least one embedded magnet in communicate with at least a second embedded magnet of a second rotational element in the close loop sub-assembly. The magnetic relationship between the first and second magnet forces the second rotational element in the closed loop sub-assembly to rotate in response to rotation of the first rotational element subject to fluid flow in the closed-loop chamber (410). The closed loop chamber of the closed loop sub-assembly transfers heat from a heat source in communication with the closed loop sub-assembly to the open loop sub-assembly (412). In one embodiment, at step (412) the heat is transferred from the heat source to the fluid in the chamber (128). The transferred heat exits the open loop sub-assembly through the fluid outlet (126b), as shown in FIG. 1, in communication with the cooling channel (414). In one embodiment, the logic shown herein is on demand with a sensor to monitor temperature output of a heat source and activate the heat exchanger in response to the monitored temperature exceeding a threshold. Similarly, the sensor may de-activate the heat exchanger in response to the monitored temperature falling below a fixed or programmable threshold. In another embodiment, the hardware of the heat source in communication with the heat exchanger may fluctuate among active and inactive states, including but not limited to: ON, OFF, Hibernate, Reduced Power, etc. The sensor may be configured to monitor the state of the hardware and to control activation of the heat exchanger based upon the state of the heat source. Accordingly, the open and closed loop sub-assemblies function together to dissipate heat from a heat source.

Figure 5:
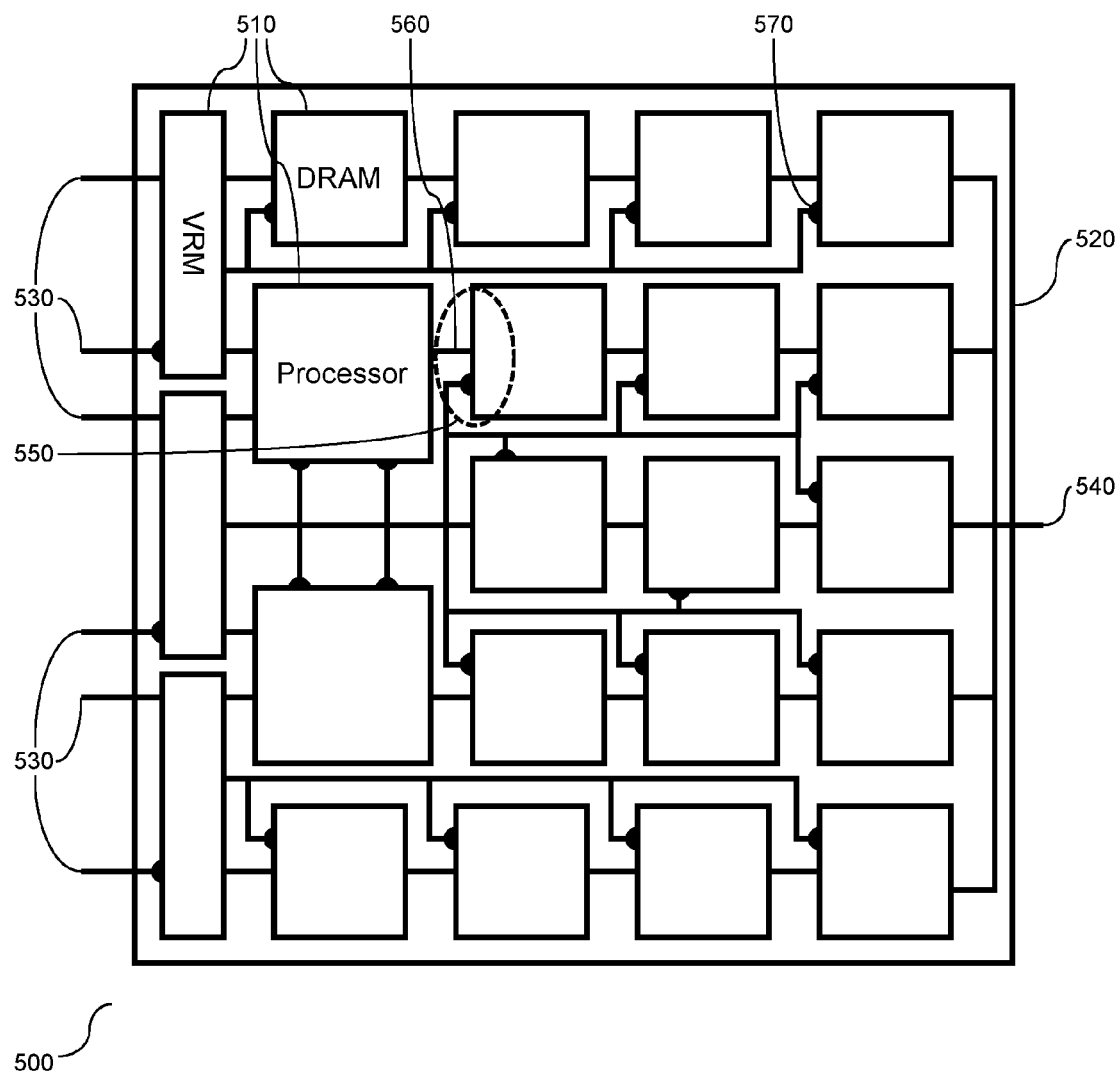
FIG. 5 is a block diagram illustrating an embodiment of a closed-loop sub-assembly.

FIG. 5 is a block diagram (500) illustrating another embodiment of a cooling assembly. The cooling assembly (500) is fabricated as a plurality of cooling elements (510) encapsulating a coolant fluid and connected with each other by channels (530). Each cooling element (510) is assigned its own position within the closed loop sub-assembly, the position being associated with a corresponding heat source element on a circuit board (520). The circuit board (520) includes one or more heat source elements, such as a processor, a random access memory (RAM), and a voltage regulator module (VRM). Each cooling element (510) is proximal to a corresponding heat source element. Multiple fluid input channels (530) are provided in communication with the cooling elements (510). The fluid input channels (530) branch between cooling elements to provide cooling fluid for each of the cooling elements (510). A fluid output channel (540) is provided to combine the fluid from all channels (530) running between the cooling elements (510). Each cooling element (510) is in communication with one or more fluid input and output channels including modulated and un-modulated fluid channels. A modulated fluid channel, such as for example channel (550), can be in a closed or open state depending on the temperature of an associated heat source element. In contrast, an un-modulated fluid channel (560) is always in an open state. Locations where the fluid input channels can be closed are identified as nodes (570).

Figure 6:
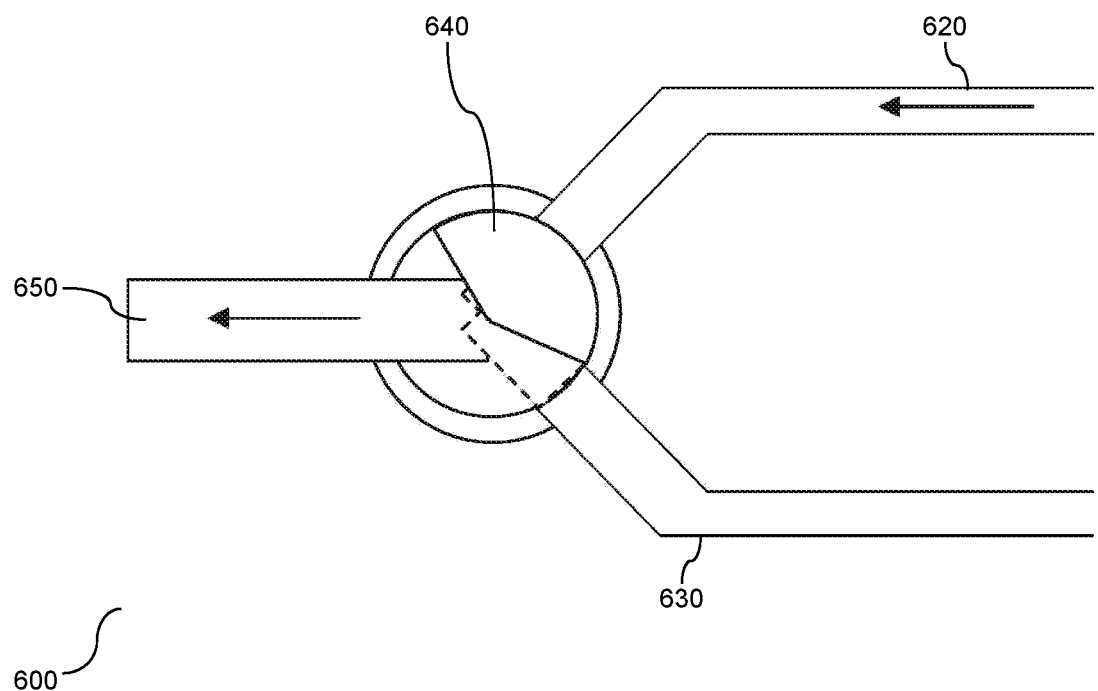
FIG. 6 is a block diagram illustrating modulated fluid channels of the embodiment shown in FIG. 5.

FIG. 6 is a block diagram (600) illustrating the modulated fluid channels shown in FIG. 5. A modulated fluid channel includes at least one nominal coolant line (620), at least one on-demand coolant line (630), a valve (640), and a single coolant line (650) in communication with a heat exchanger assembly. The on-demand coolant line (630) can be open or closed by operating the valve (640). If the temperature of a heat source exceeds a threshold, the fluid on-demand line (630) associated with the heat exchanger opens and the fluid flows into the cooling element on one side and exits the cooling element on another thereby cooling an associated heat producing element. Similarly, if the temperature of a heat source does not exceed a threshold, the fluid on-demand line (630) associated with the heat exchanger either closes or remains closed. In an embodiment that employs a control system to manage the heat exchanger apparatus activation, the control system is in communication with the valve to control opening and closing thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be appreciated that, although specific embodiments of the invention have been described herein for purposes of illustration, various modifications may be made without departing from the spirit and scope of the invention. In particular, the closed-loop member may be fabricated as "pillows" or "bubbles" from two sheets of a thin metallic foil, encapsulating the coolant during the closed-loop member assembly process. The pillows or bubbles may be formed via embossing or an alternative known process. Further, the pillows or bubbles could be singulated for independent next level assembly or they could be retained in the metallic foil sheets, being formed so that each pillow or bubble has an assigned position. Accordingly, the scope of protection of this invention is limited only by the following claims and their equivalents.

We claim:

1. An apparatus comprising:
    a first rotational element housed within a first chamber and having a first magnet;
    a second rotational element housed within a second chamber and having a second magnet;
    the first magnet in magnetic communication with the second magnet;
    the first chamber in communication with a fluid channel having a fluid inlet and a fluid outlet, wherein the fluid inlet and the fluid outlet are co-planar to the fluid channel;
    a heat source positioned proximal to the second chamber; the heat source to control entry of a first viscous fluid into the first chamber via the inlet with a first flow, and the fluid inlet to direct the first flow to rotate the first rotational element; and
    a magnetic property to communicate with the second magnet of the second chamber in response to the rotation of the first rotational element and to rotate the second rotational element.

2. The apparatus of claim 1, further comprising rotation of the second rotational element to create a fluid flow with a second fluid in the second chamber.

3. The apparatus of claim 2, further comprising rotation of the second fluid to remove heat from the heat source.

4. The apparatus of claim 3, further comprising said second chamber in thermal communication with said first chamber, and said second chamber to transfer heat removed from the heat source to the first viscous fluid in the first chamber.

5. The apparatus of claim 4, further comprising the first viscous fluid subject to the heat transfer to exit the first chamber via the fluid outlet.

6. The apparatus of claim 2, wherein the fluid flow is controlled as a function of a monitored temperature of the heat source and a threshold temperature.

7. The apparatus of claim 6, wherein the threshold temperature is fixed.

8. The apparatus of claim 6, wherein the threshold temperature is variable.

9. The apparatus of claim 6, wherein the fluid flow activates in response to the monitored temperature exceeding the threshold temperature.

10. The apparatus of claim 6, wherein the fluid flow de-activates in response to the monitored temperature falling below the threshold temperature.

11. The apparatus of claim 1, wherein the first rotational element further comprises a first blade housed within the first chamber and the first magnet embedded in the first blade.

12. The apparatus of claim 11, wherein the second rotational element further comprises a second blade housed within the second chamber and the second magnet embedded in the second blade.

13. The apparatus of claim 1, wherein the viscous fluid is a liquid.

14. The apparatus of claim 1, wherein an axis of rotation of the first rotational element is perpendicular to the fluid channel.

15. The apparatus of claim 1, wherein the fluid inlet and fluid outlet are co-planar to a rotation of the first rotation element.

16. The apparatus of claim 1, wherein the fluid channel confines the fluid flow to the fluid inlet and the fluid outlet.

17. An apparatus comprising:
    a first rotational element housed within a first chamber, the first chamber having a fluid inlet and a fluid outlet, the first rotational element having a first hub and at least two first blades radially positioned in communication with the first hub, at least one of the first blades having an embedded first magnet;
    a second rotational element housed within a second chamber, the second rotational element having a second hub and at least two second blades radially positioned in communication with the second hub, and at least one of the second blades having an embedded second magnet;
    a heat source positioned adjacent to and in communication with the second chamber;

the first magnet in magnetic communication with the second magnet;

the heat source to control entry of a first viscous fluid into the first chamber via the inlet with a first flow, and the first flow to rotate the first rotational element; and a magnetic property to communicate with the second magnet in response to the rotation of the first rotational element and to rotate the second rotational element.

18. The apparatus of claim 17, further comprising a fluid channel in communication with the first chamber, the channel comprising the fluid inlet and the fluid outlet, wherein the inlet and the outlet are co-planar to a rotation of the first rotational element, and wherein the fluid channel confines the first fluid flow to the fluid inlet and the fluid outlet.

19. The apparatus of claim 18, wherein the viscous fluid is a liquid.

20. The apparatus of claim 17, wherein the first rotational element is an impeller.

* * * * *